(12) United States Patent
Huang et al.

(10) Patent No.: US 7,067,419 B2
(45) Date of Patent: Jun. 27, 2006

(54) MASK LAYER AND DUAL DAMASCENE INTERCONNECT STRUCTURE IN A SEMICONDUCTOR DEVICE

(75) Inventors: Robert Y S Huang, Ocoee, FL (US); Scott Jessen, Orlando, FL (US); Subramanian Karthikeyan, Orlando, FL (US); Joshua Jia Li, Vancouver, WA (US); Isaiah O. Oladeji, Orlando, FL (US); Kurt George Steiner, Orlando, FL (US); Joseph Ashley Taylor, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 216 days.

(21) Appl. No.: 10/721,126

(22) Filed: Nov. 25, 2003

(65) Prior Publication Data

US 2004/0121579 A1    Jun. 24, 2004

Related U.S. Application Data

(63) Continuation of application No. 10/026,257, filed on Dec. 21, 2001, now abandoned.

(51) Int. Cl.
*H01L 21/467* (2006.01)

(52) U.S. Cl. .................. 438/638; 438/736; 438/738

(58) Field of Classification Search ............. 438/638
See application file for complete search history.

(56) References Cited

U.S. PATENT DOCUMENTS

| | | | | |
|---|---|---|---|---|
| 5,882,996 | A | * | 3/1999 | Dai .......................... 438/597 |
| 6,309,962 | B1 | * | 10/2001 | Chen et al. ................. 438/638 |
| 6,312,874 | B1 | | 11/2001 | Chan et al. |
| 6,331,479 | B1 | * | 12/2001 | Li et al. .................... 438/618 |
| 6,514,852 | B1 | * | 2/2003 | Usami ....................... 438/624 |
| 6,537,908 | B1 | | 3/2003 | Fornof et al. |
| 6,559,070 | B1 | * | 5/2003 | Mandal ...................... 438/781 |
| 2001/0004550 | A1 | * | 6/2001 | Passernard ................. 438/618 |
| 2002/0117760 | A1 | | 8/2002 | Gates et al. |
| 2002/0173163 | A1 | | 11/2002 | Gutsche |
| 2003/0064582 | A1 | * | 4/2003 | Oladeji et al. ............. 438/638 |

FOREIGN PATENT DOCUMENTS

WO    WO 01/43171 A1    6/2001

\* cited by examiner

*Primary Examiner*—Stephen W. Smoot

(57) ABSTRACT

A mask layer having four mask films used in the fabrication of an interconnect structure of a semiconductor device. The first mask film and the third mask film have substantially equal etch rates. The second mask film and the fourth have substantially equal etch rates film, and different from that of the etch rate of the first and third mask films. A via is etched to the first mask film. Then a trench is etched to the third mask film of the mask layer. The via and trench are then etched in a dielectric material. The second, third and fourth mask films are removed and the first mask film remains a passivation layer for the dielectric material. A conductive metal is deposited in the via and trench.

19 Claims, 15 Drawing Sheets

MASK LAYER AND DUAL DAMASCENE INTERCONNECT STRUCTURE IN A SEMICONDUCTOR DEVICE

This application is a continuation of U.S. application Ser. No. 10/026,257 filed Dec. 21, 2001, now abandoned.

BACKGROUND OF THE INVENTION

The present invention relates generally to the fabrication of interconnect structures on a semiconductor device. More specifically, this invention pertains a dual damascene process used in the fabrication of interconnect structures and to interconnect structures incorporating low-k dielectric materials.

Several different dual damascene processes may be utilized in the fabrication of interconnect structures. One such process is the full via-first ("FVF"), which is illustrated in FIGS. 1 through 4. As shown in FIG. 1, a structure 10 prior to etching may have an interconnect layer 11 in which there is formed a metal interconnect feature 8. Overlaying layer 11 and feature 8 is a barrier layer 14. Over barrier layer 14 are two dielectric layers 12 and 13 separated by an intermediate etch stop layer 15. A patterned photoresist ("PR") layer 16 is deposited over top dielectric layer 13.

A via feature is patterned in the photoresist layer 16 of a device or structure 10 using photolithography. As shown in FIG. 2, a via 17 is etched through the dielectric layers 13 and 12, and the etch stop layer 15, to the barrier layer 14. The photoresist layer 16 is then stripped from the semiconductor device and replaced with a new or fresh photoresist layer (not shown). A trench feature is patterned in the fresh photoresist layer. As shown in FIG. 3, a trench 18 is etched through the dielectric layer 13 to the etch stop layer 15. The fresh photoresist layer is then stripped. The etch stop layer 15 and the insulative barrier layer 14, exposed in the via 17, are then selectively etched. A thin copper barrier (not shown) together with a copper film 19 is then deposited in the trench 18 and via 17. The semiconductor device is planarized using chemical mechanical planarization to form the interconnect structure shown in FIG. 4.

As described above, after the via 17 is etched through the dielectric layers 12 and 13, a fresh photoresist material is deposited on the device 10, filling the via 17. A self-planarizing antireflection coating/photoresist, or ARC/photoresist, is used to provide a planar surface for sufficient focusing of the photolithographic instrument. Some drawbacks from the use of ARC/photoresist include the potential for micro-trench formation and the extension of the overall etch time required to remove the ARC in the via, with no guarantee that the via will be completely cleared. These problems can lead to reduced yield and less reliable devices.

Another problem exists in the interaction of the ARC/photoresist with the amine impurities in "low-k dielectric materials." Dielectric materials having lower dielectric constants are known as low-k dielectric materials and have become increasingly popular in the fabrication of interconnect structures of semiconductor devices. The low-k dielectric materials typically have dielectric constants up to about 3.0. However, low-k dielectric materials are chemically reactive with photoresist materials or have impurities that react with the photoresist materials when the latter comes into contact with the low-k dielectric materials.

Reactions between the low-k dielectric materials and the photoresist materials are more severe during the trench formation where, apart from a surface interaction, there is also interaction within the via. This reaction between the photoresist material and the low-k dielectric material then blocks the trench patterning and prevents fabrication of interconnect structures using the traditional FVF dual damascene process.

These drawbacks have led to the use of alternative dual damascene processes that incorporate the use of a mask layer (also referred to as a "hard mask layer") deposited over the low-k dielectric materials. A mask layer as used herein is a layer that includes a film, or composite films, that overlay a dielectric material in an interconnect structure, and serves as a barrier layer between a photoresist layer and a dielectric material. A mask layer may also be referred to as a hard mask layer or photoresist mask, which terms may be used interchangeably in this disclosure. The mask layer protects specific regions of the dielectric materials during the etching process.

The hard mask layers known in the prior art typically include two layers of different property films. The two mask films may include a first mask film usually consisting of SiC or $Si_3N_4$ and a second mask film consisting of silicon dioxide ($SiO_2$). The two hard mask films prevent the photoresist materials from coming into contact with the low-k dielectric material during via and trench photolithography and etching. In addition, the first mask film, SiC or $Si_3N_4$, protects the low-k dielectric films from chemical mechanical polishing. It also serves as an insulator or diffusion barrier for the metal film to be deposited in a trench and via where its function is to prevent surface current or metallic ion leaks from the conductive metal deposited in the trench. The second hard mask film serves as a sacrificial layer where the trench or via is initially etched and is eliminated after the completion of all processes. It also helps protect the underlying dielectric layers when the via or trench pattern thereon is transferred to the underlying dielectric layers.

Dual damascene processes incorporating a mask layer are the partial-trench-first in a two layer hard mask (also referred to as the "PTF-2LM"), and the partial-via-first in two layer hard mask (also referred to as the "PVF-2LM"). A PTF-2LM dual damascene process is illustrated in FIGS. 5–8. The semiconductor device 20 shown in FIG. 5 includes a dielectric material comprising a via dielectric layer 22 and a trench dielectric layer 21 deposited over an underlying interconnect layer 23 having a conductive line 24. An insulative barrier layer 25 is disposed between the metal layer 23 and the via dielectric layer 22. An etch stop layer 26 is disposed between the via dielectric layer 22 and the trench dielectric layer 21. A mask layer 27, having a first mask film 27A and second mask film 27B, overlays the dielectric material. A photoreisist layer 28 has been deposited on the mask layer to pattern the trench feature.

With respect to FIG. 6, a site for the trench feature is first patterned in the photoresist layer 28, and then etched through the second mask film 27B to the first mask film 27A. The photoresist layer 28 is then removed, and replaced with a fresh photoresist layer 28A filling the trench 30. With respect to FIG. 7, a via 29 feature is patterned in the fresh photoresist layer 28A and etched through the dielectric layers 21, and 22 and to the insulative barrier layer 25. The fresh photoresist layer 28 is then stripped.

As shown in FIG. 8, the feature for the trench 30, which was patterned and etched in the mask layer 27, is then etched through the trench dielectric layer 21 to the etch stop layer 26. Since there is no photoresist material protection, an etch chemistry is chosen such that when the trench dielectric layer 21 is being etched, the first mask film of the mask layer is not etched. In a separate etching procedure, the etch stop layer 26 within the trench 30 and the barrier insulative layer 25, within the via 29, are selectively etched (not shown) so the via 29 may connect an underlying conductive line 24 to a conductive line formed in the trench 30.

The via 29 connects the conductive line 24 to the line formed in the trench 30. In order to achieve an optimum product yield and reliability, the via and trench features must align satisfactorily. In the above described PTF-2LHM dual damascene process the trench 30 is first aligned with the underlying metal line 24, and then the via 29 is aligned with the trench 30 or the metal line 24. A misalignment of the trench 30 with the metal line 24 will impact the alignment or connectivity of the via 29. If the via 29 is also misaligned with respect to the trench 30, the error is compounded. Misaligned interconnect features can result in increase current leakage, via contact resistance, and via chain resistance which all lead to yield loss.

Accordingly, the preference is to first align the via with the underlying metal line and etch it, which is done in the PVF-2LHM dual damascene process as shown in FIGS. 9 through 12. A via 39 feature is patterned in the photoresist layer 31 and then etched into the second mask film 32B of dual mask layer 32. The photoresist layer 31 is stripped and replaced with a fresh photoresist layer 46. A trench 30 feature is then patterned in the fresh photoresist layer 46. A via 39 is first etched through the first mask film 32A of mask layer 32 to a predetermine depth of trench dielectric 33 using an etch chemistry that is selective to the first mask film 32A. The trench 30 feature in the photoresist 46 is now etched into the second mask film 32B of mask layer 32. Then the via 39 is etched through the via dielectric layer 34 to the insulative barrier layer 37 as shown in FIG. 11. With respect to FIG. 12, the trench 30 is then etched through the trench dielectric layer 33 in accordance with the feature previously patterned in the photoresist layer and etched in the second mask film 32B of the mask layer 32. In a separate etching procedure, the etch stop layer 38 within the trench 30 and the barrier insulative layer 37, within the via 39, are selectively etched. The via 39 then connects an underlying conductive line 36 to a conductive line formed in the trench 30.

Misalignment in the PVF-2LHM dual damascene process can result in a reduced width of the via. With respect to FIG. 13, a semiconductor device is shown having a via 41 etched to predetermined depth of a mask layer 40 having a first mask film 40A and a second mask film 40B. A photoresist layer 42 is deposited over the mask layer 40, and a trench feature 43 is shown patterned in the photoresist layer 42 through the second mask film 40B. As represented by the dashed lines in FIG. 13, the trench feature 43 is misaligned with respect to the partially etched via 41 in the mask layer 40. When the via 41 is subsequently etched through the photoresist 42 and the dielectric material, the via 41 dimension is not fully etched in the dielectric material. The dashed line in FIG. 14, represents the originally patterned dimension of the via 41. However, as the original dimension of the via 41 did not fall within the trench feature 43 patterned in the new photoresist layer 42, the entire dimension of the via 41 cannot be etched through the dielectric material. Accordingly, the via size has been reduced. The trench 45 is then etched in the dielectric material and displaced to a side of the conductive line 44 as a result of the misalignment. The reduction in the via size which may lead to increase in via contact and chain resistances and poor device reliability and yield.

SUMMARY OF THE INVENTION

The present invention solves the foregoing problems with the use of a novel mask layer in the dual damascene fabrication of an interconnect structure. The mask layer may be especially effective with a low-k dielectric material. A low-k dielectric material or low-k dielectric layer, as used in this specification, comprises those organosilicate dielectric materials and organic dielectric materials having dielectric constants up to about 3.

A mask layer is deposited over a dielectric material which overlays an underlying metallic layer. The mask layer has four mask films including a first mask film that serves as an insulative film and/or a passivation layer (also referred to as the "passivation mask film"). Three mask films, including a second mask film, a third mask film and a fourth mask film, are deposited over the first mask film.

The mask films' composition are such that the first mask film has etch properties that are substantially identical to the etch properties of the third mask film while the second mask film has etch properties that are substantially identical to the etch properties of The fourth mask film. The term "etch properties" as used in this specification are those characteristics of a film or layer composition including the etch rate and etch selectivity for a given etch chemistry and/or etching procedure.

The first mask film and the third mask film comprise $SiO_2$ or SiC, which are known film composition for mask films. Alternatively, these mask films may also comprise $Si_3N_4$, or some other suitable compound that has an acceptable etch selectivity with respect to the dielectric material. The second mask film and the fourth mask film are similarly composed of the same materials chosen to have an appropriate etch selectivity with respect to the dielectric material.

Utilizing a dual damascene process, a via feature and trench feature are patterned and then etched in the mask layer. The via feature is etched to a predetermined depth of the mask layer, or through the first three films. The trench feature is also etched to a predetermined depth of the mask layer but only through the first mask film. The dual damascene process may incorporate a partial via first (or "PVF") procedure in which the via is formed in the mask layer before the trench to avoid the misalignment problems of a partial trench first ("PTF") procedure.

The via and/or the trench are not transferred to the underlying dielectric material until both the via and the trench are first etched into the mask layer, and any photoresist material is stripped from the device. In this manner, the via can be fully transferred to the dielectric material without reducing the width of the via despite the misalignment of the trench with a trench in the underlying interconnect layer.

A via and trench are then etched in the dielectric material in accordance with the features patterned and etched in the mask layer. The sacrificial films are removed during the steps of etching the via, trench, etch stop layer or insulative barrier, depending on the etch chemistry of the selected films or layers, or during chemical mechanical polishing when the processes are completed. After the via and trench are etched within the dielectric layer, and a conductive metal is deposited therein, the conductive metal is planarized using chemical mechanical planarization to complete the interconnect structure.

BRIEF DESCRIPTION OF DRAWINGS

For a better understanding of the invention, reference is made to the following detailed description taken in conjunction with the accompanying drawings in which.

DETAILED DESCRIPTION OF THE DRAWINGS

Figure 1:
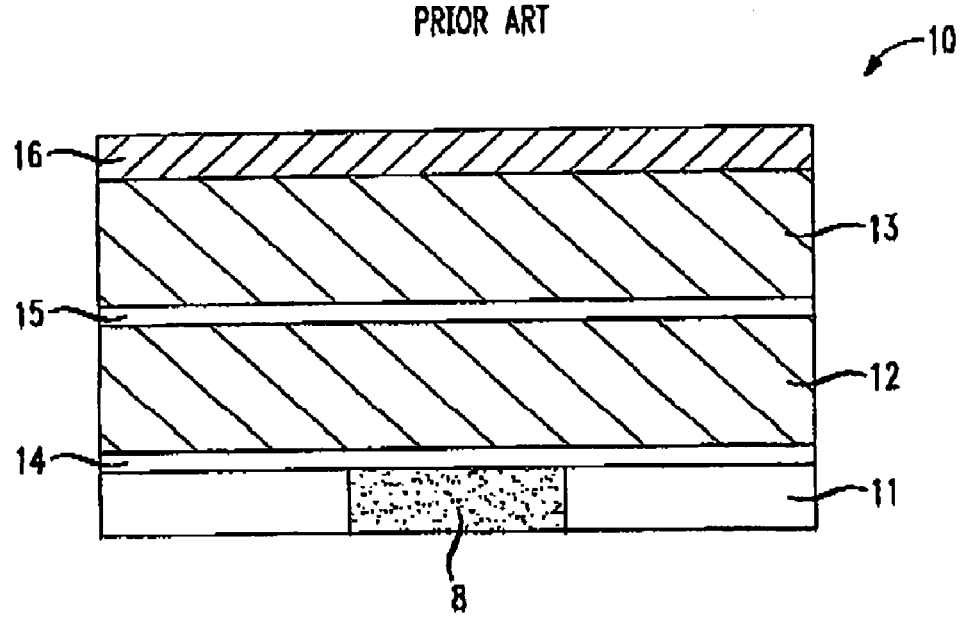
FIGS. 1 through 4 illustrate a full-via-first dual damascene process.
Figure 2:
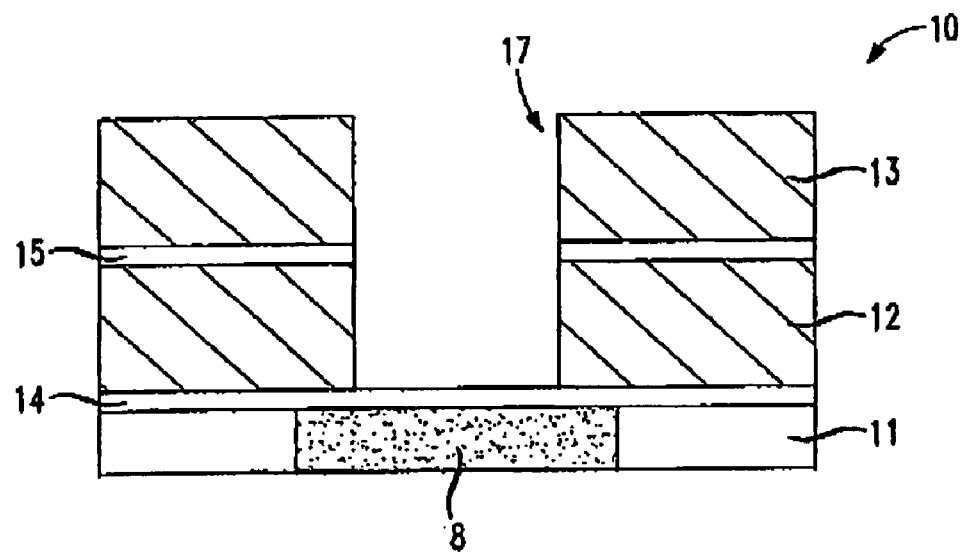
Figure 3:
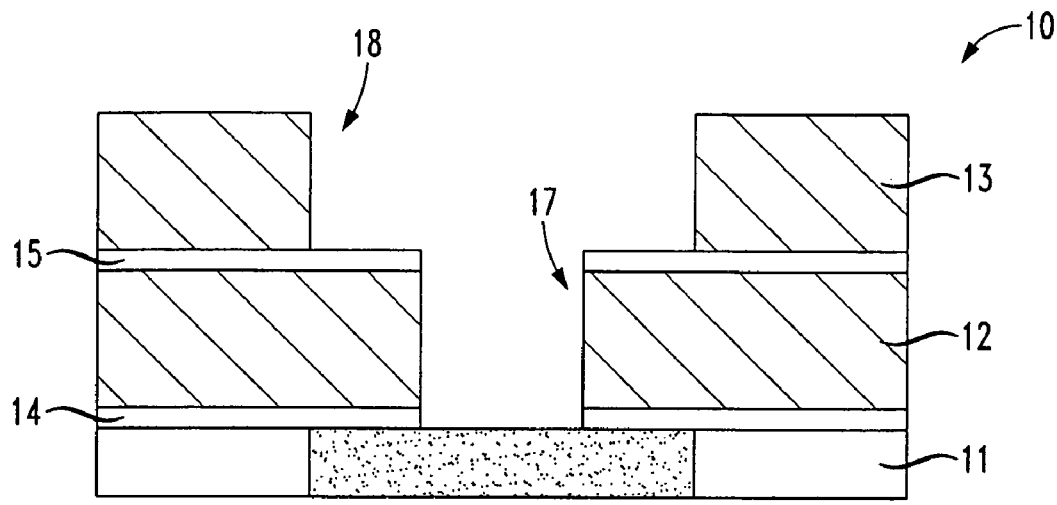
Figure 4:
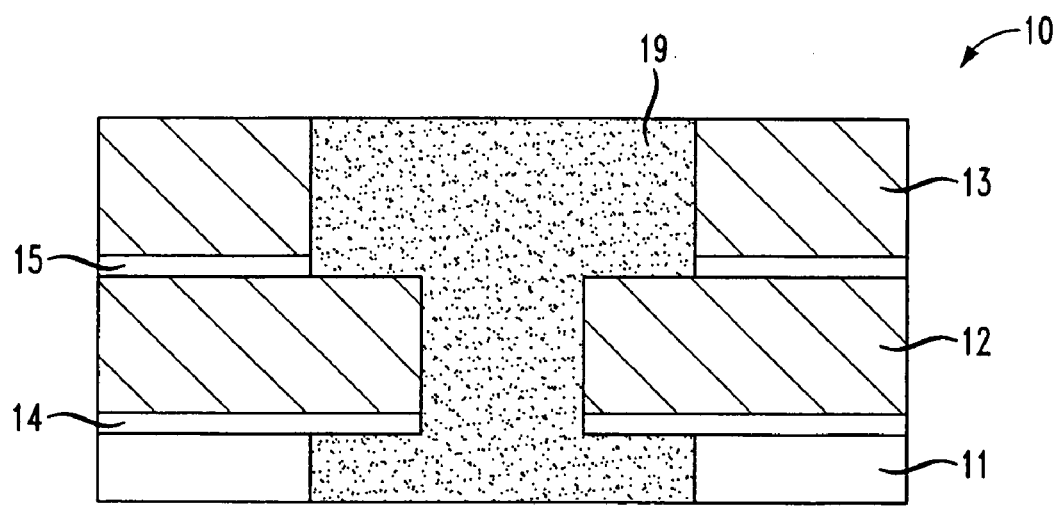
Figure 5:
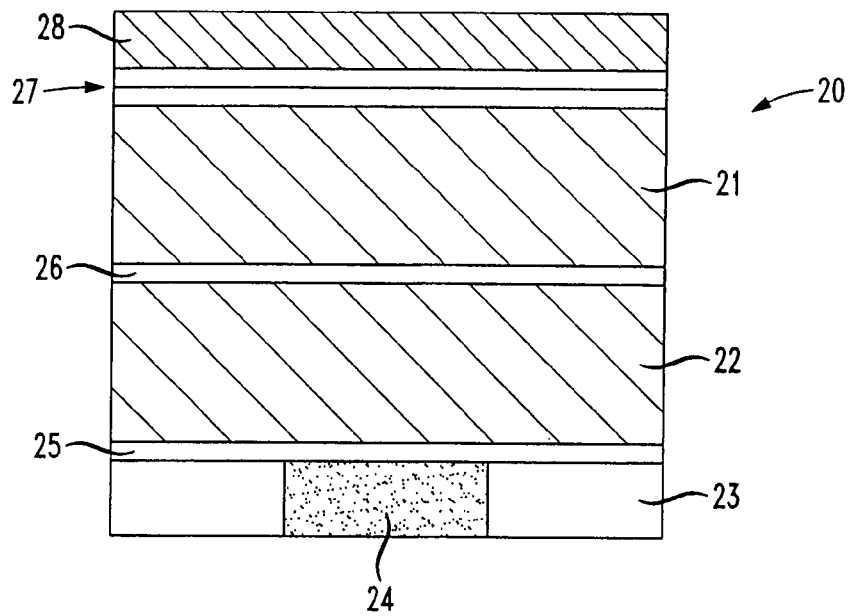
FIGS. 5 through 8 illustrate a partial-trench-first with two layer hard mask (PTF-2LHM) dual damascene process.
Figure 6:
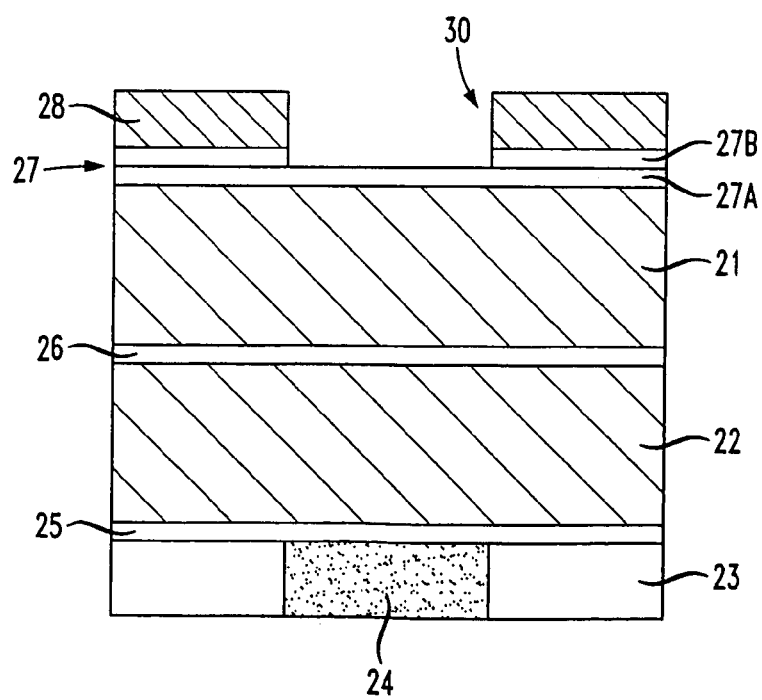
Figure 7:
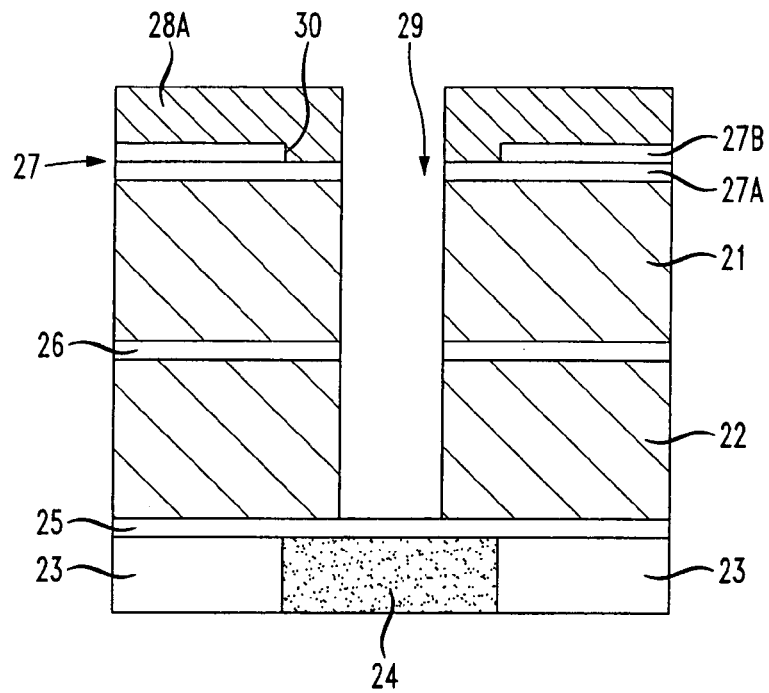
Figure 8:
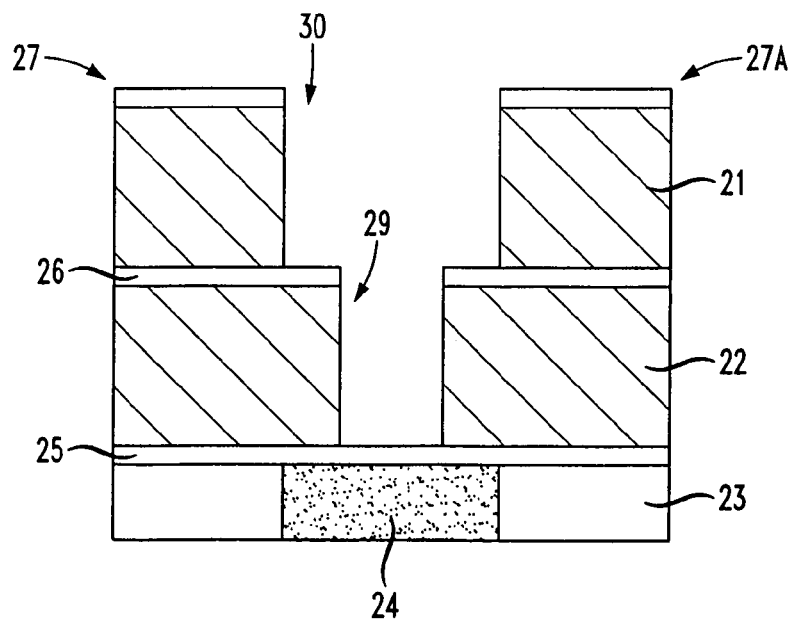
Figure 9:
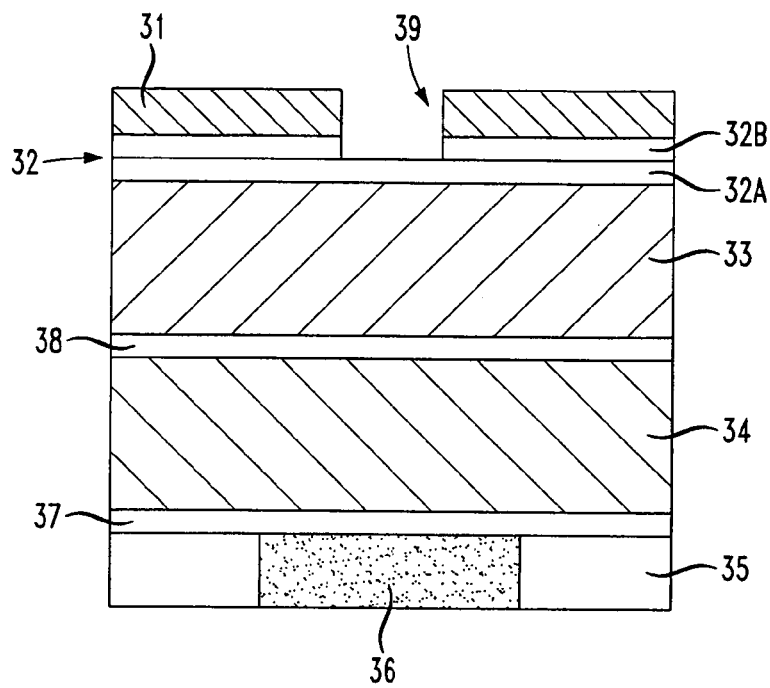
FIGS. 9 through 12 illustrate a partial-via-first with two layer hard mask (PVF-2LHM) dual damascene process.
Figure 10:
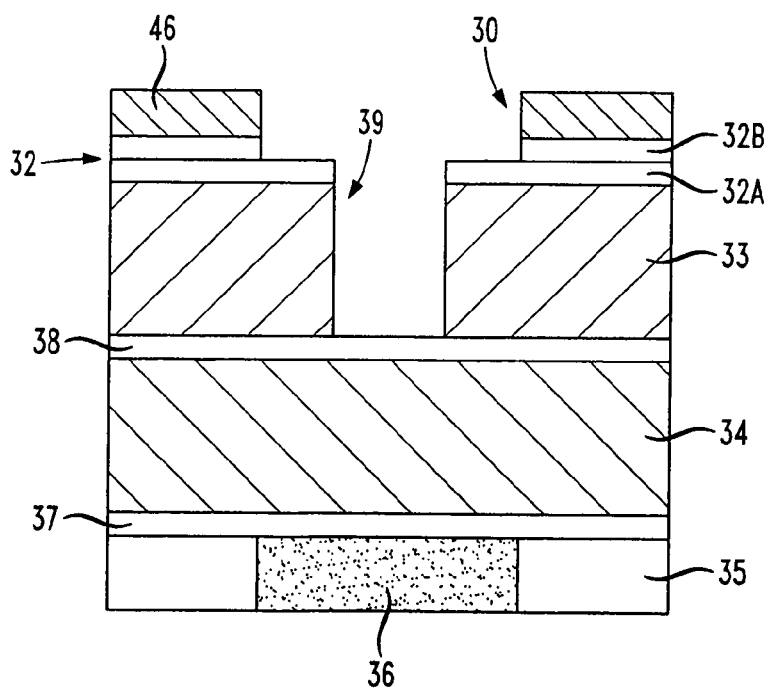
Figure 11:
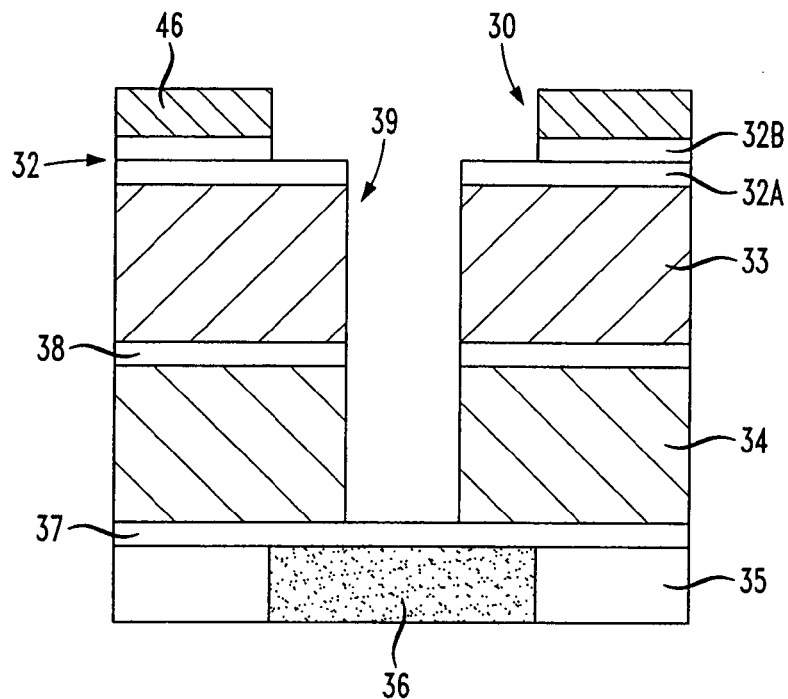
Figure 12:
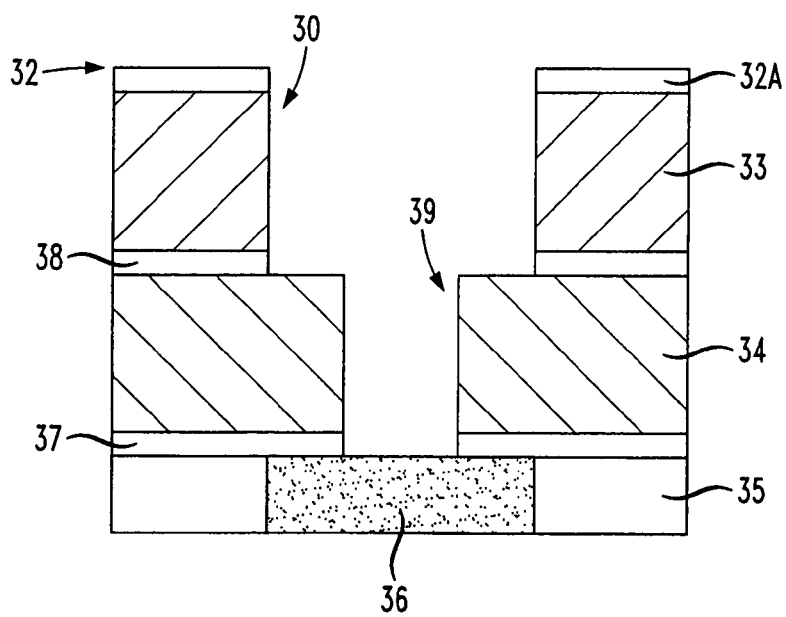
Figure 13:
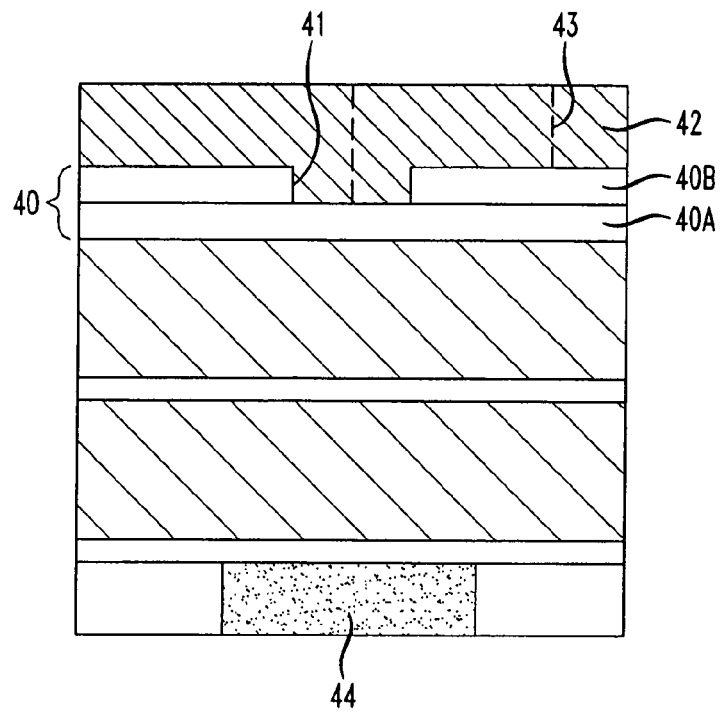
FIGS. 13 and 14 illustrate a PVF-2LHM dual damascene process in which the via size has been reduced.
Figure 14:
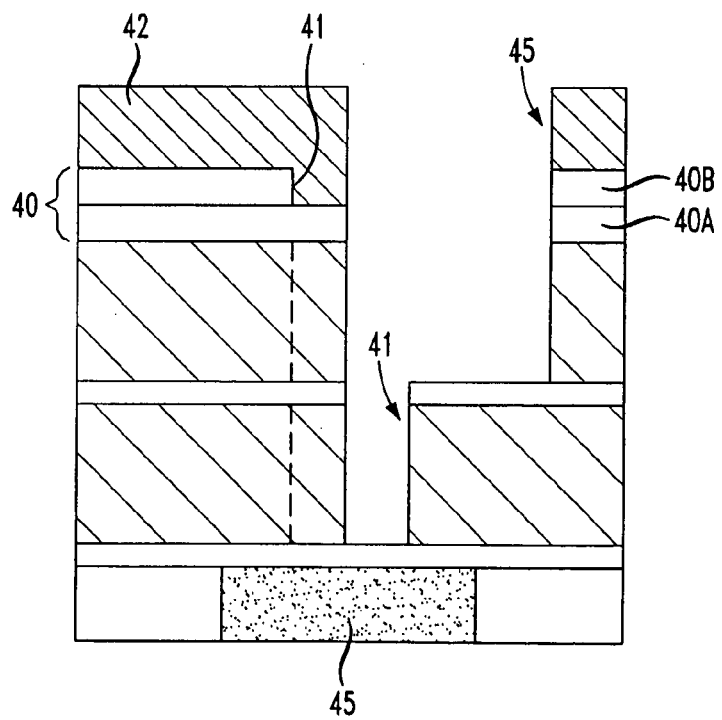
Figure 15:
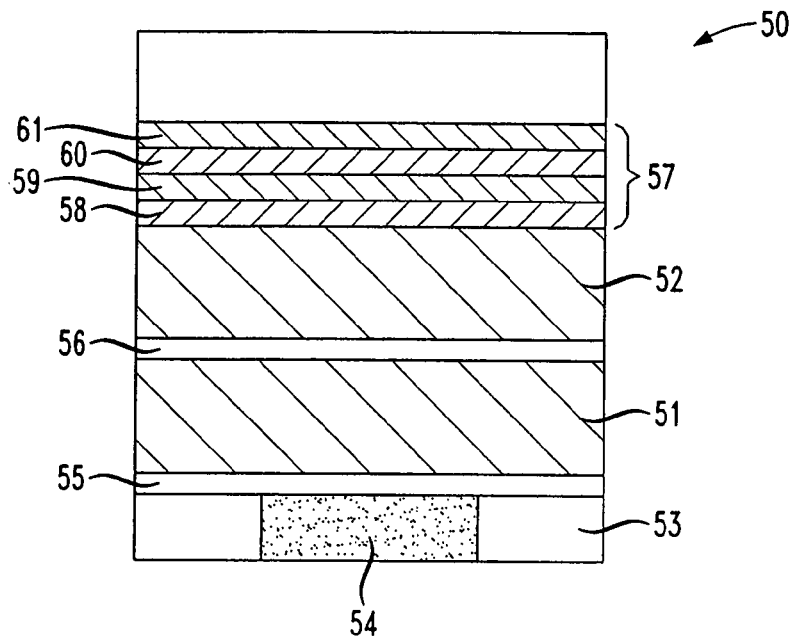
FIGS. 15 through 26 illustrate the novel mask layer and dual damascene process of the present invention.
Figure 16:
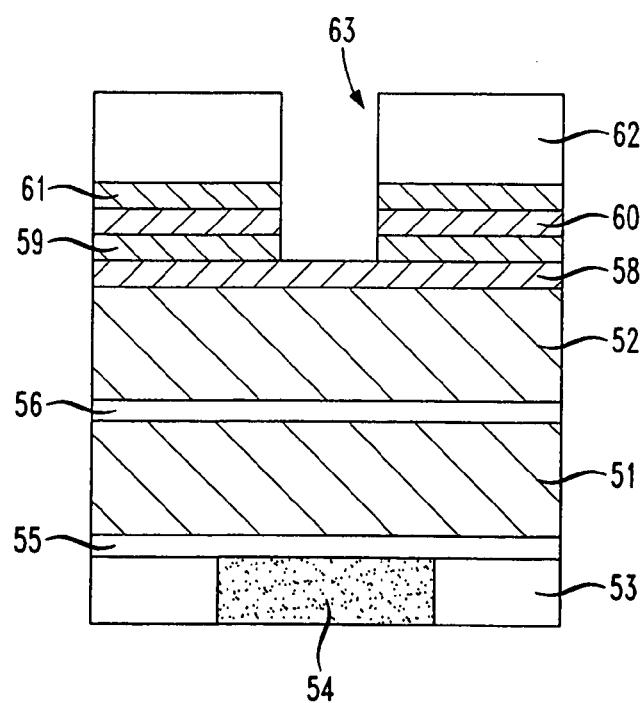

A sectional view of an interconnect layer of an integrated circuit device or structure 50 is shown in FIG. 15, and includes a low-k dielectric material including a via dielectric layer 51 and a trench dielectric layer 52 formed over an underlying interconnect layer 53 having a conductive metal 54. Via dielectric, as used in this specification, refers to the portion of a dielectric layer in which a via is formed. A trench dielectric layer refers to a dielectric layer in which a trench is formed. The via dielectric layer 51 is first deposited over a barrier layer 65. The via dielectric layer 51 may comprise any organosilicate or organic low-k dielectric material having a dielectric constant up to about 3.0. Standard dielectric materials and such low-k dielectric materials used are CORAL manufactured by Novellus, BLACK DIAMOND manufactured by Applied Materials, or SILK manufactured by Dow Chemical Company, Inc. An etch stop layer 56 is then deposited over the via dielectric layer 51. A trench dielectric layer 52 is formed over the etch stop layer 56 and comprises the same dielectric material used in the via dielectric layer 51.

The via dielectric layer 51 may typically range in thickness from about 3000 to about 6000 A, and the trench dielectric layer 52 may range in thickness from about 1500 A to about 6000 A. The etch stop layer 56 and the insulative barrier layer 55 have a thickness ranging up to about 500 A.

These examples of film thickness are not intended to limit the present invention to such ranges of thickness. The insulative barrier layer 55 usually comprises silicon nitride ($Si_3N_4$) or silicon carbide (SiC). Silicon dioxide is typically not an acceptable component for a barrier layer; however, the etch stop layer may comprise any of the three materials including $SiO_2$, $Si_3N_4$ or SiC.

A mask layer 57 is then deposited over the trench dielectric layer 52. The mask layer 57 serves as a barrier between the dielectric material and a photoresist layer 62 deposited on the mask layer 57. The mask layer 57 depicted in FIG. 15 has four mask films including a first mask film 58, a second mask film 59, a third mask film 60 and a fourth mask film 61. The mask films 58 through 61 range from about 200 A to 1000 A each in thickness, and are composed of a material having a sufficiently high etch selectivity with respect to the dielectric material to effectively transfer a via or trench feature patterned in the mask layer to the underlying dielectric material. For example, mask films are typically composed of $Si_3N_4$, $SiO_2$ or SiC.

As will be explained in more detail, in the present invention, the first mask film 58 should have etch properties, for a given etch chemistry and/or procedure, that are substantially identical to the etch properties of the third mask film 60. Similarly, the second mask film 59 should have etch properties substantially identical to the etch properties of the fourth mask film 61. If the first mask film 58 is composed of $Si_3N_4$, then the third mask film 60 is preferably composed of $Si_3N_4$; and if the second mask film 59 is composed of $SiO_2$, or SiC, then the fourth mask film 61 is composed of $SiO_2$, or SiC. Thus, composition and the etch properties of the mask films 58 through 61 should alternate from the first mask film 58 to the fourth mask film 61.

The first mask film 58 is a passivation layer. By definition, the passivation layer protects the underlying dielectric layers 51 and 52 from contamination. In addition, the first mask film 58 serves as an insulator. The first mask film 58 remains as a component of the interconnect structure and prevents surface current leakage between conductive lines. The first mask film 58 may also be referred to as a passivation mask film.

Figure 17:
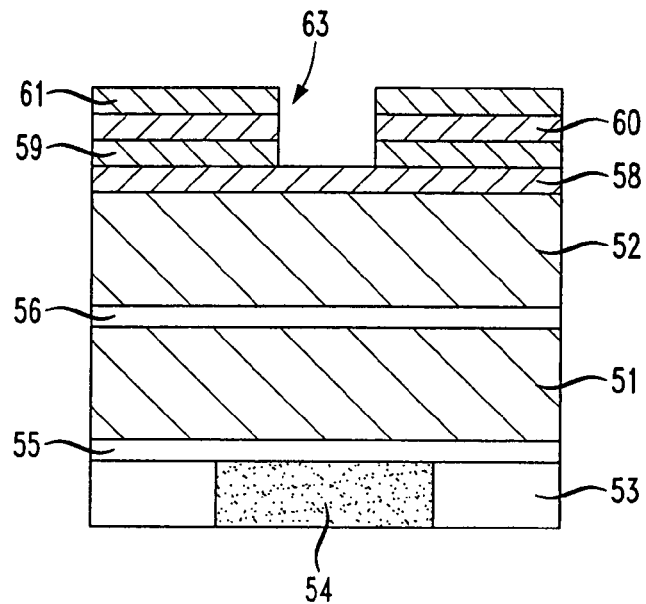
Figure 18:
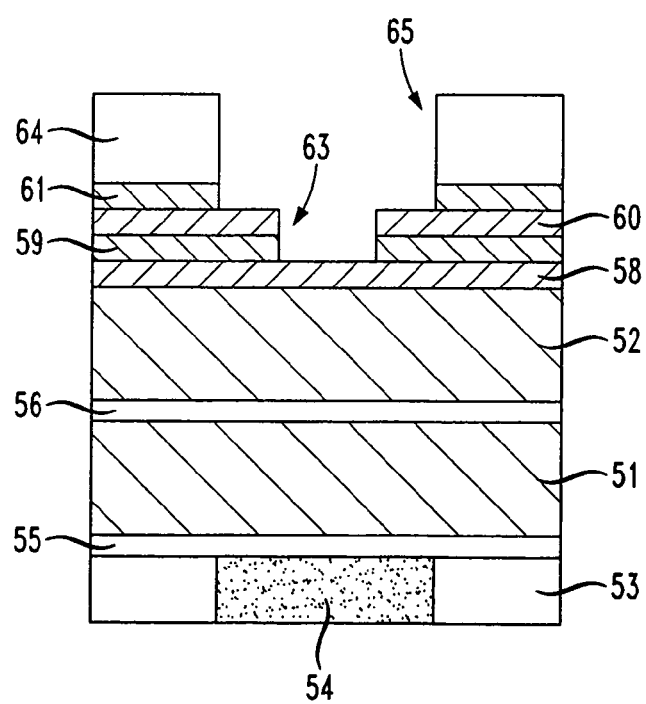

The dual damascene process of the present invention is depicted in the FIGS. 16 through 25. The dual damascene process of the present invention generally follows the above described partial-via-first with two layer hard mask scheme, but is distinguishable in several respects as a result of the use of a four layer hard mask. A via feature is first patterned in the photoresist layer 62, and a via 63 etched in the mask layer 57 down to the first mask film 58. The photoresist layer 62 is then stripped as shown in FIG. 17. A new photoresist layer 64 is formed over the mask layer 57, filling the via 63. A trench feature is then patterned in the photoresist layer 64. As shown in FIG. 18, a trench 65 is then etched into the mask layer 57 down to the third mask film 60.

Figure 19:
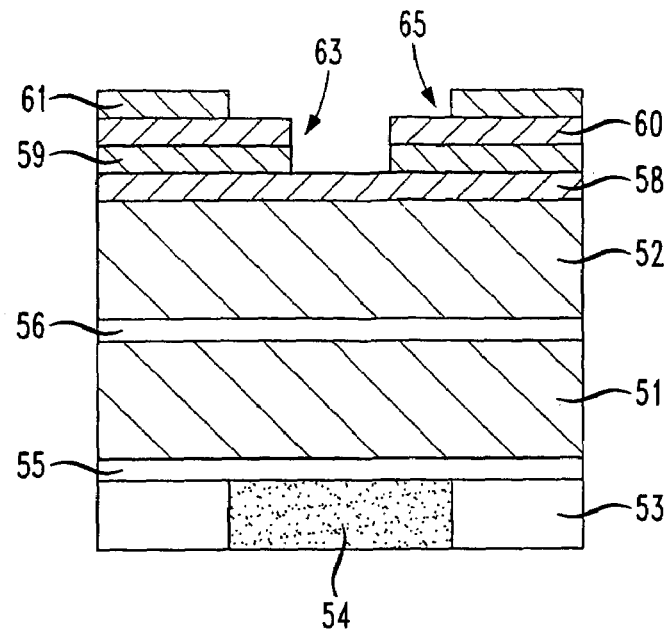

In the present invention, the mask layer 57 has two additional mask films enabling a trench 65 to be first etched in the mask layer 57 before the via 63 and the trench 65 are etched through the underlying dielectric material. As shown in FIG. 19, The photoresist layer 64 is removed before the features 63 and 65 are etched in the dielectric material. As will be explained in more detail, saving the trench 65 in the mask layer 57 avoids reduction of via size.

Figure 20:
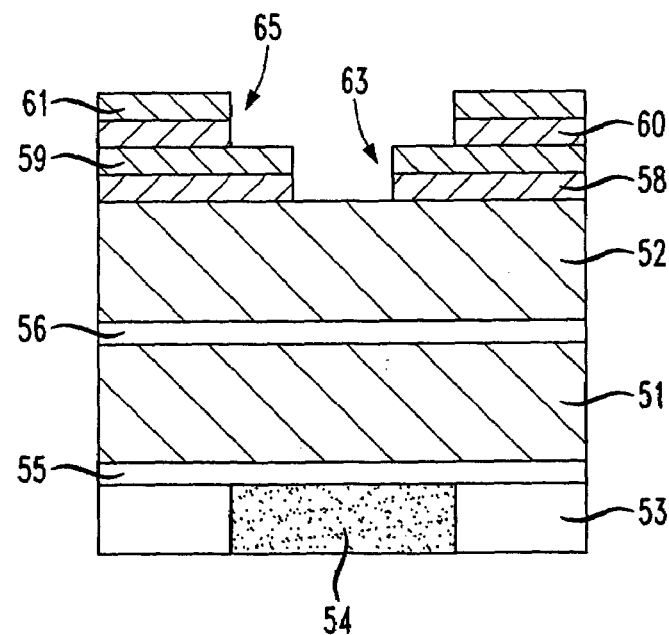

With respect to FIG. 20, that portion of the first mask film 58 remaining within the via 63 dimension is etched, and that portion of the third mask film 60 within the trench 65 dimension is also etched in a single step. As noted above the first mask film 58 and third mask film 60 have similar etch chemistries and etch rates, or are composed of the same compound so these portions of the mask films 56 and 60 will be removed in the same etch steps.

Figure 21:
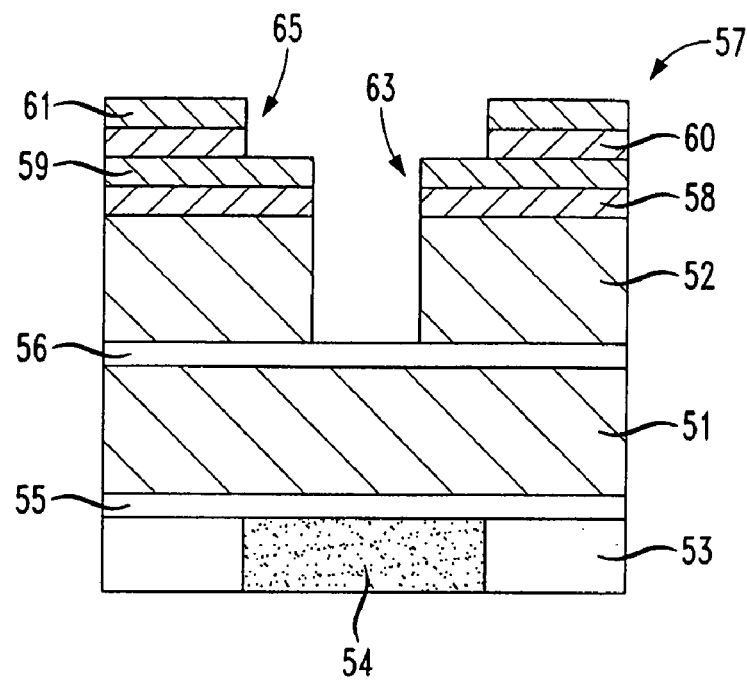
Figure 22:
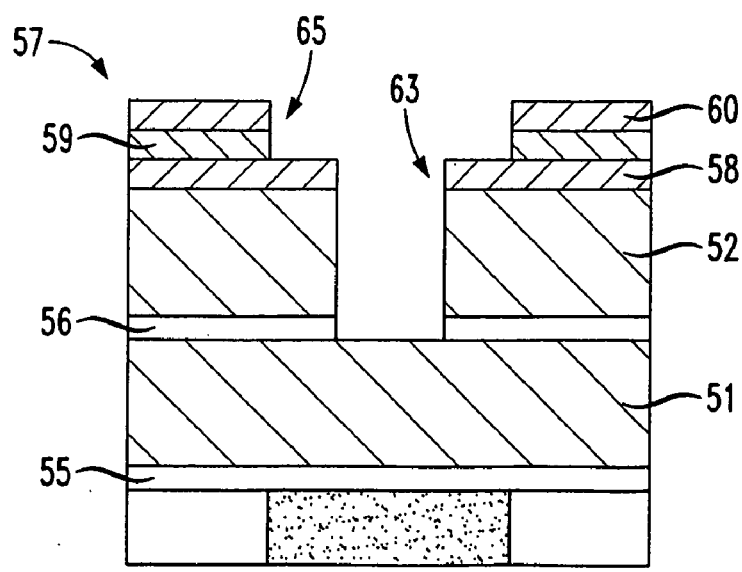

In FIG. 21, a via 63 has been etched through the mask layer 57 and the trench dielectric layer 52 to the etch stop layer 56. With the via now etched in the dielectric material, the sacrificial films 59–61 can be sequentially removed; however, the trench feature is maintained in the mask layer 57 in order to transfer the trench 65 to the underlying dielectric material. As shown in FIG. 22, the fourth mask film 61 is removed when the trench 65 is etched into the mask film 59. In as much as the second mask film 59 has etch properties identical to that of the fourth mask film 61, a portion of the second mask film 59 within the trench 65 pattern is also removed.

Figure 23:
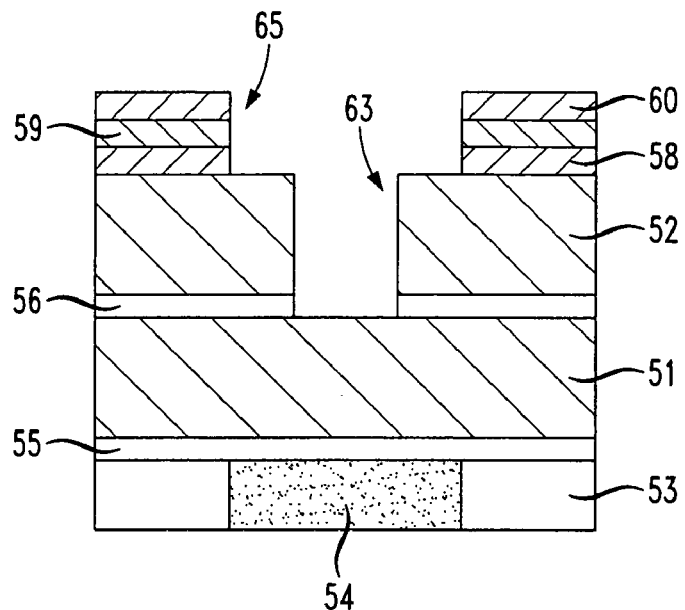

In addition, the etch stop layer in the illustrated embodiment has etch properties similar to the etch property of the second mask film and the fourth mask film 61. Accordingly, the etch stop layer 56 is removed when portions of the fourth mask film 61 and second mask film 59 are removed as shown in FIG. 23. Alternatively, if the etch stop layer comprises a material having an etch property similar to that of the first mask film and third mask film 60, portions of the mask films 58 and 60 may be removed during the etching procedure for the etch stop layer.

In a separate step, a portion of the first mask film 58 in the partial trench 65 is removed so that the first mask film 58, second mask film 59 and third mask film 60 define the trench 65.

Figure 24:
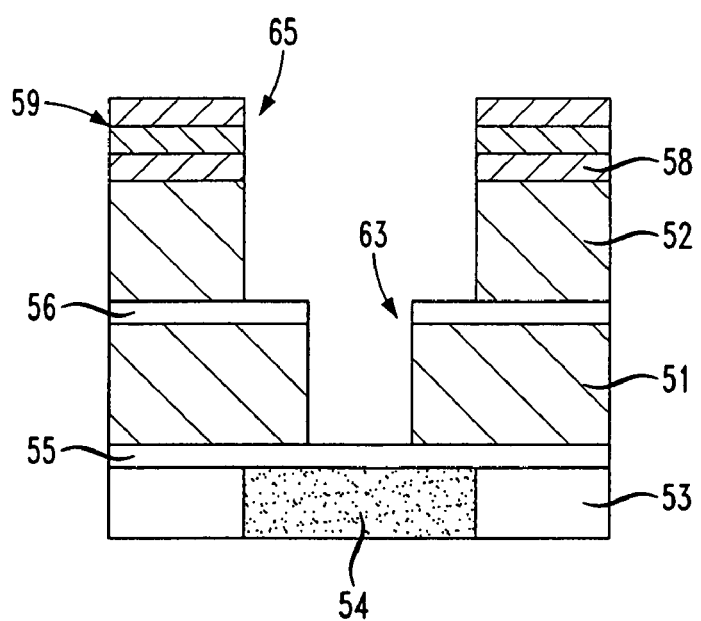
Figure 25:
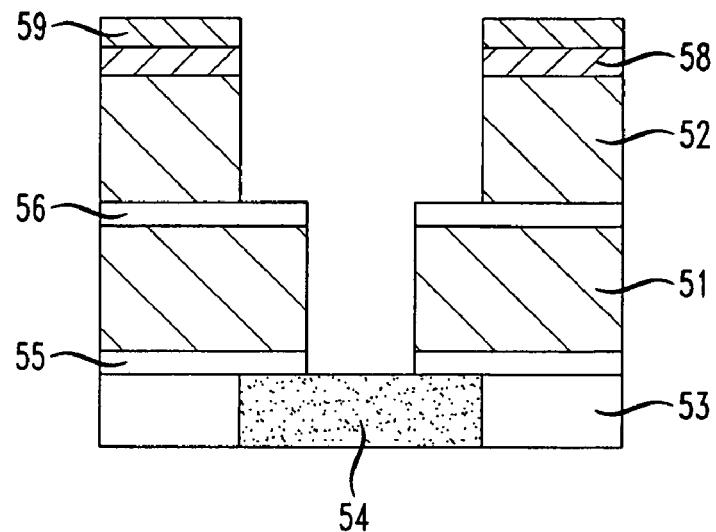

The via 63 is then etched through the via dielectric layer 51 down to the barrier layer 55, and the trench 65 is simultaneously etched through the trench dielectric layer 52 as shown in FIG. 24. The barrier layer 55 is then selectively etched to expose conductive line 54 as shown in FIG. 25, and the remaining portion for third mask film 60 may be removed. The only remaining mask film of the mask layer 57 is the first mask film 58, and the second mask film 59. The first mask film 58 is the passivation layer and will be part of the device structure after processing.

Figure 26:
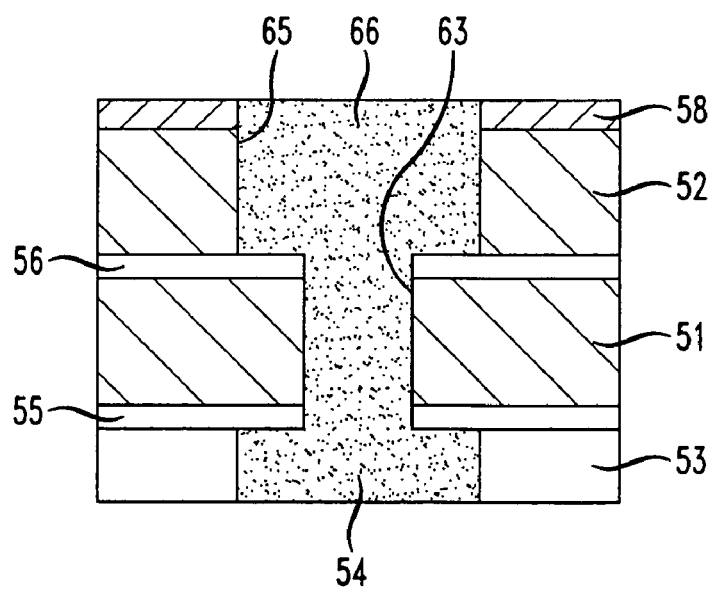

As shown in FIG. 26, a conductive metal 66 is deposited in the via 63 and the trench 65. A thin copper barrier layer and copper seed layer are first deposited using sputtering or chemical vapor deposition techniques (CVD), which is followed by a thick copper film deposition to fill the via 63 and trench 65 using electroplating. Chemical mechanical planarization (CMP) is used to eliminate excess conductive metal outside the trench 65, and remove remnants of the mask films 59–60, so the first mask film 58 remains adjacent the conductive metal 66. In this manner the interconnect structure shown in FIG. 26 is created using a dual damascene procedure, and includes a via 63 electrically connecting the underlying conductive line 54 with a conductive line formed in the trench 65.

Figure 27:
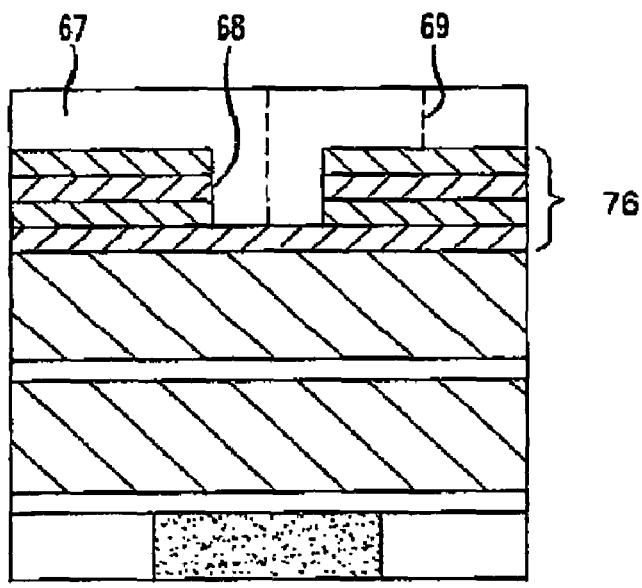
FIGS. 27 through 29 illustrate the novel mask layer and dual damascene process of the present invention when a trench has been misaligned on a semiconductor device.
Figure 28:
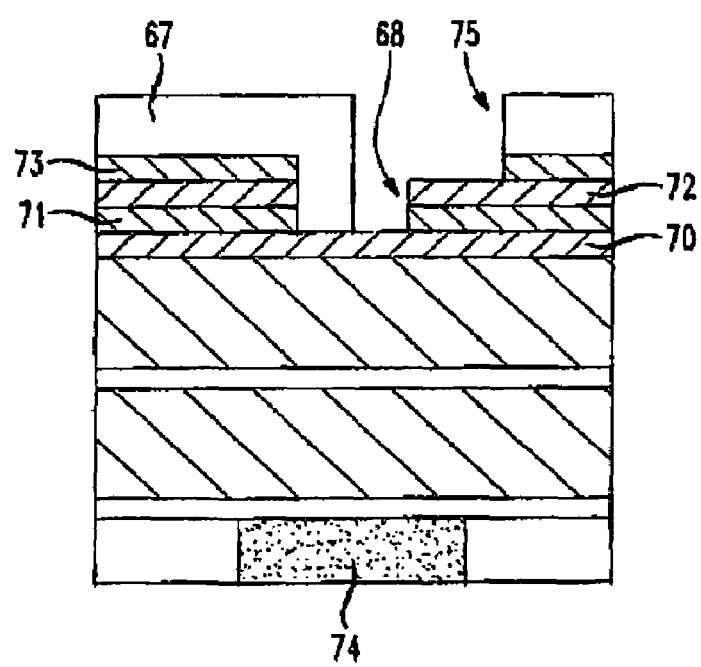
Figure 29:
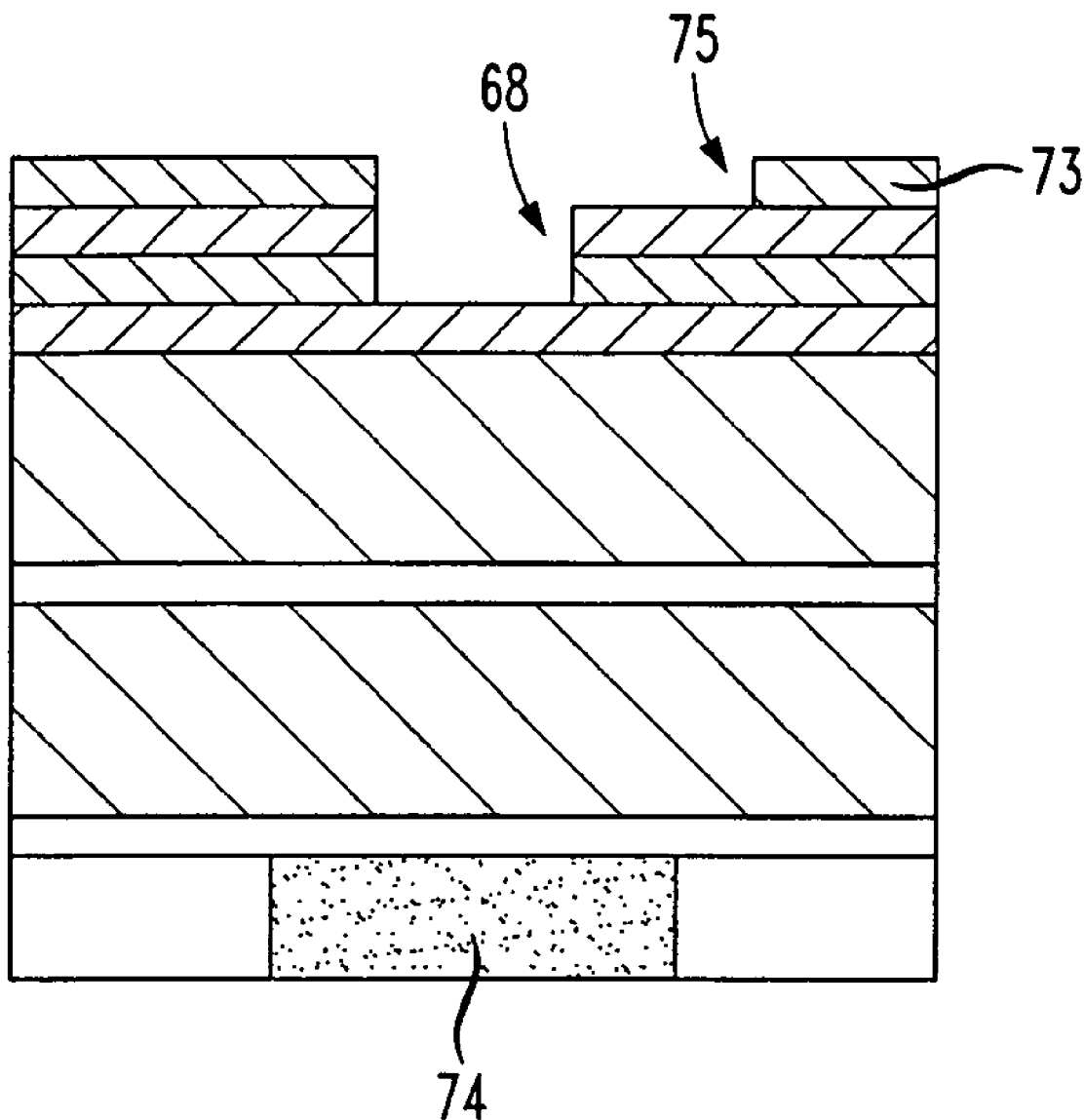

With respect to FIGS. 27 through 29, a trench feature 69 is shown misaligned with respect to the via 68 when patterned in a photoresist layer 67. A via 68 is first patterned in a photoresist layer and etched in the mask layer 66. The photoresist layer is removed and replaced with photoresist layer 67 as shown in FIG. 27. A trench feature 69—represented by dashed lines—is patterned in the photoresist layer 67; however, the trench feature is misaligned, or displaced to a side of the via 68.

A trench 75 is then etched through photoresist layer 67 and into the mask layer 76 through the fourth mask film 73. When the photoresist layer 67 is removed, as shown in FIG. 29, the via 68 and trench 75 are formed in the mask layer 76. The photoresist material is removed from the via 68, so the misalignment of the trench 75 does not result in the reduction of the size of the via 68.

In the present invention, the trench 75 is patterned in the mask layer 76, so the photoresist layer can be stripped from the device, before the trench and the via are etched any further. When the photoresist layer 67 is removed the entire width of the via 68 is exposed to the etching procedures, thus the via size cannot be reduced even if the trench has been misaligned.

While the preferred embodiments of the present invention have been shown and described herein in the present context, it will be obvious that such embodiments are provided by way of example only and not of limitation. Numerous variations, changes and substitutions will occur to those of skilled in the art without departing from the invention herein. For example, the present invention need not be limited to best mode disclosed herein, since other applications can equally benefit from the teachings of the present invention. Accordingly, it is intended that the invention be limited only by the spirit and scope of the appended claims.

What we claim in the invention is:

1. A method for avoiding effects due to a misalignment that may occur between features in an interconnect structure of a semiconductor device, the interconnect structure having a dielectric material deposited over an underlying interconnect layer and having a via extending through the dielectric material for establishing a connection between an underlying conductor and a trench in an upper portion of the dielectric material, said method comprising the steps of:
    (a) forming a mask layer over the dielectric material, said mask layer comprising at least two pairs of mask films;
    (b) etching the mask layer to a first predetermined depth forming a via within the mask layer without exposing the underlying dielectric material;
    (c) etching the mask layer to a second predetermined depth of the mask layer less than the first predetermined depth forming a trench within the mask layer without exposing the underlying dielectric material;
    (d) in the event a misalignment occurs between the via and the trench within said mask layer, removing from the via within said mask layer a material left in said via due to said misalignment, thereby restoring the via within said mask layer to its original size;
    (e) forming a via through the dielectric material to the underlying conductor corresponding to the dimensions of the via formed within the mask layer; and
    (f) forming a trench in the dielectric material to a predetermined depth of the dielectric material corresponding to the dimensions of the trench formed within the mask layer, thereby ensuring dimensional correspondence of the via and trench in the dielectric material to the via and trench within the mask layer notwithstanding the occurrence of said misalignment.

2. The method of claim 1 wherein a layer of photoresist constitutes the material removed from the via within said mask layer.

3. The method of claim 1 wherein the via and trench farmed within the mask layer constitute the features in the interconnect structure where said misalignment may occur.

4. The method of claim 1 wherein said dielectric material comprises a via dielectric layer formed over the interconnect layer, a barrier layer disposed between the via dielectric layer and the interconnect layer, a trench dielectric layer formed over the via dielectric layer, and an etch stop layer disposed between the trench dielectric layer and the via dielectric layer.

5. The method of claim 4 wherein the step of forming the via comprises etching the via through the via dielectric layer and the barrier layer, and the step of forming the trench comprises etching the trench through the trench dielectric layer.

6. A method for avoiding effects due to a misalignment that may occur between features in an interconnect structure using a mask layer deposited over a dielectric material which has been deposited over an underlying interconnect layer, said method comprising the steps of:
    (a) forming a first mask film over the dielectric material having a known set of etch properties;
    (b) forming a second mask film over the first mask film having a known set of etch properties different from the etch properties of the first mask film;
    (c) forming a third mask film over the second mask film having etch properties substantially identical to the etch properties of the first film;
    (d) forming a fourth mask film over the third mask film having etch properties substantially identical to the etch properties of the second mask film;

(e) etching the second, third and fourth mask films to form a via within the mask layer to a first predetermined depth and down to the first mask film without exposing the underlying dielectric layer;

(f) etching at least the fourth mask film to form a trench within the mask layer to a second predetermined depth less than the first predetermined depth of the mask layer previously etched in the mask layer without exposing the underlying dielectric material; and (g) in the event a misalignment occurs between the via and the trench within said mask layer, removing from the via within said mask layer a material left in said via due to said misalignment, thereby restoring the via within said mask layer to its original size.

7. The method of claim 6 wherein the via and trench formed within the mask layer constitute the features in the interconnect structure where said misalignment may occur.

8. The method of claim 6 wherein the interconnect layer includes a conductor and further comprising the steps of forming a via through the dielectric material to the underlying conductor corresponding to the dimensions of the via formed within the mask layer, and forming a trench in the dielectric material to a predetermined depth of the dielectric material corresponding to the dimensions of the trench formed within the mask layer.

9. The method of claim 6 further comprising the steps of etching the first mask film to process the via in the mask layer to expose the underlying dielectric material, and etching the third mask film to form the trench in the mask layer down to the second mask film.

10. The method of claim 9 further comprising the steps of forming a via through the dielectric material, and forming a trench in the dielectric material to a predetermined depth of the dielectric material after forming a trench in the mask layer down to the first mask film.

11. The method of claim 10 further comprising the step of removing the third and fourth mask films from the semiconductor device.

12. The method of claim 10 further comprising the step of removing the second, third, and the fourth mask films from the semiconductor device.

13. The method of claim 9 further comprising the steps of forming a via dielectric layer over the underlying interconnect layer, forming a trench dielectric layer over the via dielectric layer, forming an etch stop layer between the via dielectric layer and trench dielectric layer.

14. The method of claim 13 further comprising the steps of etching the via in the trench dielectric layer in accordance with dimensions of the via formed in the mask layer, then simultaneously etching the etch stop layer and the fourth mask film from the semiconductor device.

15. The method of claim 13 further comprising the step of forming a barrier layer between the via dielectric layer and the interconnect layer.

16. The method of claim 15 further comprising the steps of etching the via in the via dielectric layer to the barrier layer in accordance with dimensions of the via formed in the mask layer, then simultaneously etching the barrier layer and removing the third mask film from the semiconductor device.

17. The method of claim 16 further comprising the steps of forming the trench in the trench dielectric layer, and simultaneously forming the via in the via dielectric layer before etching the barrier layer.

18. A semiconductor device having a dielectric material deposited over an underlying interconnect layer, said semiconductor comprising:

a mask layer arranged over the dielectric material for avoiding effects due to a misalignment that may occur between features in an interconnect structure of the semiconductor device, said mask layer comprising:

a first mask film adjacent to the dielectric material and having a known set of etch properties;

a second mask film over the first mask film having a known set of etch properties different from the etch properties of the first mask film;

a third mask film over the second mask film having etch properties substantially identical to the etch properties of the first film; and a fourth mask film over the third mask film having etch properties substantially identical to the etch properties to the etch properties of the second mask film, wherein at least some of the mask films are etched to a first predetermined depth of the mask layer without exposing the underlying dielectric to form a via within the mask layer, further wherein at least some of the mask films are etched to a second predetermined depth of the mask layer which is less than the depth of the via previously etched in the mask layer to form a trench within the mask layer without exposing the underlying dielectric material; and a material left in said via due to said misalignment being removable without affecting the underlying dielectric, thereby restoring the via within said mask layer to its original size prior to forming interconnect features in the dielectric material.

19. The semiconductor device of claim 18 wherein the interconnect layer includes a conductor and further comprising a via through the dielectric material to the underlying conductor corresponding to the dimensions of the via formed within the mask layer and a trench in the dielectric material to a predetermined depth of the dielectric material corresponding to the dimensions of the trench formed within the mask layer, thereby ensuring dimensional correspondence of the via and trench in the dielectric material to the via and trench within the mask layer notwithstanding the occurrence of said misalignment.

* * * * *